(12) United States Patent
Moen

(10) Patent No.: US 10,853,248 B1
(45) Date of Patent: Dec. 1, 2020

(54) IN-RACK NETWORK FOR POWER SIGNALS

(71) Applicant: Amazon Technologies, Inc., Seattle, WA (US)

(72) Inventor: Michael Jon Moen, Olympia, WA (US)

(73) Assignee: Amazon Technologies, Inc., Seattle, WA (US)

( * ) Notice: Subject to any disclaimer, the term of this patent is extended or adjusted under 35 U.S.C. 154(b) by 107 days.

(21) Appl. No.: 15/888,611

(22) Filed: Feb. 5, 2018

(51) Int. Cl.
*G06F 11/00* (2006.01)
*G06F 12/0804* (2016.01)
*H05K 7/14* (2006.01)
*G06F 11/20* (2006.01)

(52) U.S. Cl.
CPC ...... *G06F 12/0804* (2013.01); *G06F 11/2015* (2013.01); *H05K 7/1498* (2013.01); *G06F 2201/805* (2013.01); *G06F 2201/82* (2013.01); *G06F 2212/1032* (2013.01)

(58) Field of Classification Search
CPC .. H04L 12/2812; H04L 12/10; H04L 41/0668
See application file for complete search history.

(56) References Cited

U.S. PATENT DOCUMENTS

| 5,620,079 A * | 4/1997 | Molbak | G07D 1/04 194/217 |
| 6,484,863 B1 * | 11/2002 | Molbak | G07D 1/04 194/216 |
| 6,494,776 B1 * | 12/2002 | Molbak | G07D 1/04 453/32 |
| 6,752,254 B1 * | 6/2004 | Allen | G07F 9/00 194/346 |
| 7,603,139 B1 * | 10/2009 | Tom | H04M 1/0254 455/550.1 |
| 7,706,392 B2 * | 4/2010 | Ghoshal | H04L 12/10 370/419 |
| 8,321,163 B2 * | 11/2012 | Ewing | H04Q 9/00 702/60 |
| 8,674,823 B1 * | 3/2014 | Contario | H02J 1/10 340/333 |
| 2003/0237008 A1 * | 12/2003 | Freevol | G06F 1/30 713/300 |
| 2006/0148320 A1 * | 7/2006 | Yang | G06F 21/88 439/607.05 |
| 2006/0200614 A1 * | 9/2006 | Ohara | G06F 13/28 710/316 |
| 2007/0041387 A1 * | 2/2007 | Ghoshal | H04L 12/10 370/395.52 |
| 2010/0169031 A1 * | 7/2010 | Dishman | G01R 31/40 702/60 |

(Continued)

Primary Examiner — Bryce P Bonzo
Assistant Examiner — Jeison C Arcos
(74) Attorney, Agent, or Firm — Klarquist Sparkman, LLP

(57) ABSTRACT

It may be beneficial in the case of an undesired lapse of external power to provide a back-up power supply to protect electronic components in an electronic equipment rack. This can frequently be difficult and/or costly due to the necessary addition of electronic infrastructure, such as cabling and/or logic. One means of overcoming this obstacle is to utilize unused or reserved conductors in an already utilized management cable to convey a loss-of-power signal to the components in tandem with the existing cable signals.

19 Claims, 9 Drawing Sheets

(56) References Cited

U.S. PATENT DOCUMENTS

| | | | | |
|---|---|---|---|---|
| 2011/0066895 A1* | 3/2011 | Windell | ............... | G06F 11/325 |
| | | | | 714/43 |
| 2011/0113179 A1* | 5/2011 | Cartes | .................. | G06F 13/287 |
| | | | | 710/316 |
| 2012/0297098 A1* | 11/2012 | Li | ......................... | H04L 67/38 |
| | | | | 710/67 |
| 2014/0017528 A1* | 1/2014 | Uehara | ............... | H01M 2/202 |
| | | | | 429/61 |
| 2015/0117175 A1* | 4/2015 | Dharmadhikari | ... | H04L 41/0659 |
| | | | | 370/216 |

* cited by examiner

IN-RACK NETWORK FOR POWER SIGNALS

BACKGROUND

In a data center environment, a service provider may support and maintain numerous electronic components such as servers, back-up power supplies, routers, switches, etc. Some of these components can be utilized by users, such as virtual machine instances resident on client or tenant accessible servers housed in equipment racks belonging to the service provider.

In the event of a lapse in external power to components in a given equipment rack occurs, it is often desirable to provide a back-up power supply source to prevent at least some of the components from unexpectedly shutting down. Unexpected shut-downs can cause damage to both hardware and software within the service provider environment, and may even affect resources outside the service provider environment (such as at a client computing device, or even at third party devices such as an external databases or websites for which the service provider is the client).

DETAILED DESCRIPTION

Figure 1:
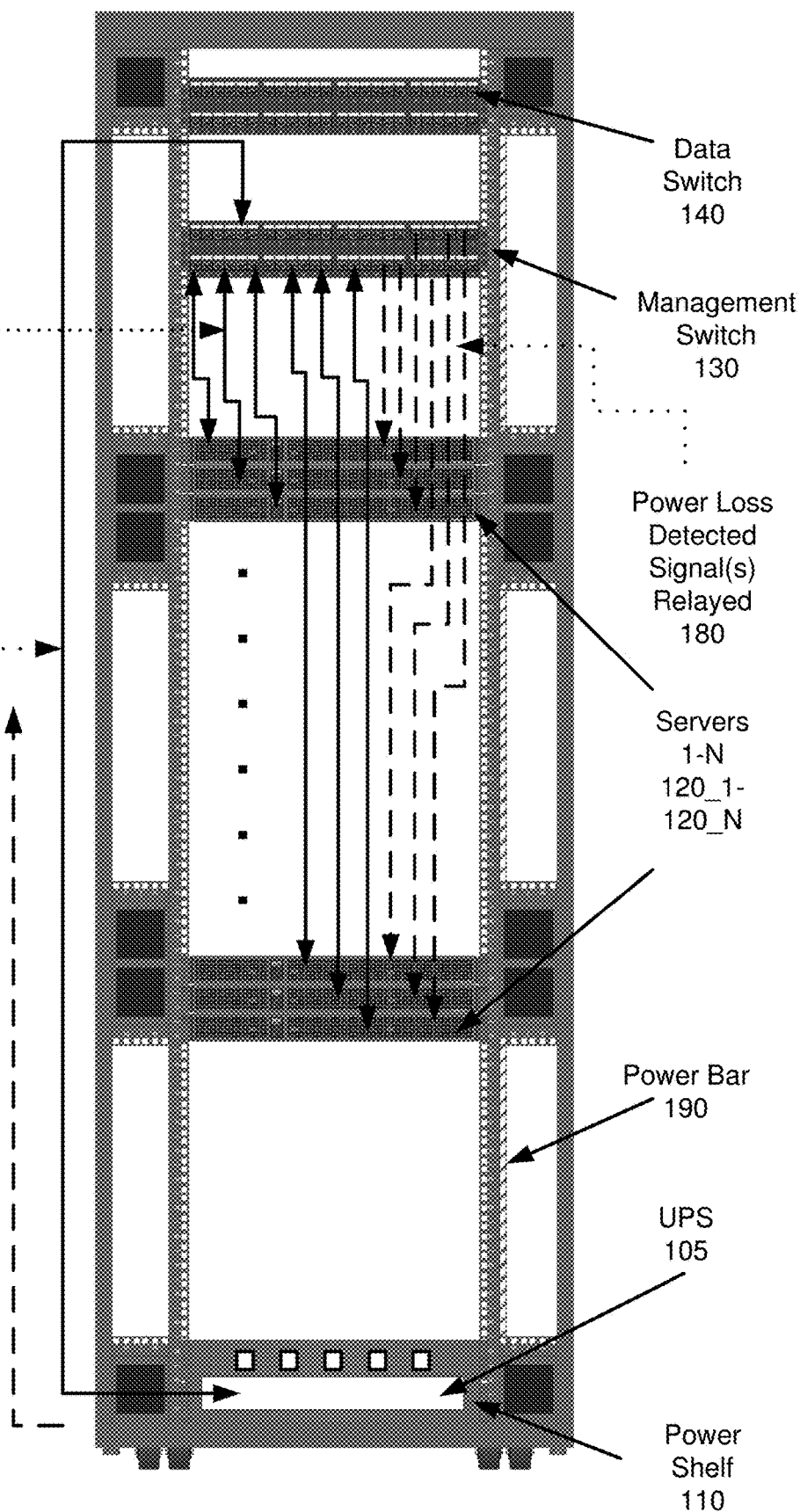
FIG. 1 depicts an embodiment of an equipment rack in accordance with an exemplary embodiment.

In the case of an undesired lapse in external power, it may be beneficial for the service provider to provide one or more back-up power supply sources to protect the components (hardware and software) maintained by and/or provided by the service provider. One way of efficiently minimizing the likelihood of a component shutting down unexpectedly is to situate the one or more back-up power supply sources within the equipment rack being protected. As will be well known to those of skill in the art, unexpectedly shutting down electronic equipment can result in numerous undesirable behaviors, such as losing sensitive unsaved data. In some other instances, an electronic component may be in the midst of an operation (such as a computation) that has already expended significant computational resources, only to be lost partially or completely. In some instances, the data may simply be corrupted. Additionally, unexpected shut-downs can cause some electronic components to exhibit other forms of unwanted behavior, such as entering a "safe mode" upon restart, exhibiting hard disk or sector errors, or requiring a full re-installation of the component's operating system. In some instances, a factory reset may even be necessary. Alternatively, sharp power transients can physically damage electronic components. Thus, there is a need to assure that an external power failure does not disrupt (or at least minimally disrupts) the operation of the electronic components supported and provided by the service provider. There is also an additional interest that, if an external power failure is imminent, mitigating steps are taken to preserve computing resources such as unsaved data, intermediary computation states or results, operating system integrity, and physical hardware (such as by properly/deliberately shutting down a component before the back-up power supply gives out).

Services are commonly used or offered in data center environments, including cloud computing environments. A service is a software function provided at a network address over a network. Clients may initiate service requests to a processing node, such as a server (one or more), and the processing node(s) may process the requests. In some instances, a processing node may return an appropriate response, may store data, may transfer data to a separate processing node, or perform any combination of any other of a number of computational services for the client. Client service requests to the processing node(s) are typically initiated using, for example, an application program interface (API) request dispatched by a client computer and received by a client-accessible server in the compute service environment provided by the service provider. However, service requests can also be initiated by any other number of network protocols without limitation. Some other service request transport protocols may include Ethernet global data (EGD), Ethernet PowerLink, ZigBee, Modbus, DirectNet, or asynchronous general-purpose input/output(s) (GPIO) that may or may not be managed by a network protocol standard (such as a resistive simple pull up or pull down signal). In some other embodiments, however, requests may be dispatched by other components within the compute service provider cloud network, such as by a switch in a neighboring equipment rack, or may even originate from third parties outside the compute service environment.

When a service request is received by a given processing node (e.g. server), the request may be accompanied by a data payload. There is no particular limitation to the data that may be included in the payload, but could include (for instance) sensitive information such as a client's name or email address, bank account or credit card information, social security number, date of birth, mother's maiden name, physical address or phone lists, software, metadata, operating system updates or modifications, etc. It is usually desired that the data payload be preserved in whole or in part in a memory of the processing node and/or kept private from unauthorized persons or parties. Thus, some or all of the data payload may be ultimately stored on the processing node, divided and/or stored redundantly between two or more processing nodes, processed by one or more of the processing nodes, or may be evaluated in any other known combination of processing/storage techniques. Additionally, the processing node may receive data from other components in the compute service environment, or from various internet sites or databases outside of the compute service environment. The processing node may even generate service requests, transitory ("scratch pad") data, or non-transitory data files itself. In some cases, any of these could be intended for whole or partial storage on the processing node in a non-volatile (long-term/permanent storage) memory. In other cases, this information may be regarded as disposable and discarded following a given operation. In either case, data received or generated by the processing node can also be dispersed between differing processing nodes without restriction and for any number of reasons including electronic processing or storage.

Henceforth, the term "server" shall be used in the place of "processing node" for purposes of simplicity and familiarity, though it is to be understood that any device capable of performing computational/processing functions such as providing storage or performing computations may constitute a "processing node," such as an external database, client computer, equipment rack switch, router, or any other known computational and/or storage component. Furthermore, there may be more than one "processing node" in a given server (such as a plurality of virtual machine instances, or VMI's, resident on a given server). Additionally, a processing node could also refer to a plurality of servers performing a computational task in concert, such as in a parallel computing environment. Furthermore, processing nodes could include non-local (e.g., quantum) qubits performing tasks in concert but without distinguishable individual mathematical or physical identities, and so forth.

Depending on the system architecture of a compute service environment, information may be held in a temporary storage of a given server upon receipt of the information, during a server processing function dependent on the information, or subsequent to the output of a server processing function derived from the information. The temporary storage could be a cache storage, a random access memory storage, a flash memory storage, a "Temp" folder that is routinely flushed (e.g. contents erased), or may even constitute a dedicated temporary storage server. In this application, the term "temporary storage" refers to any storage device or circuit that can store data.

In some embodiments, data stored in a temporary storage memory is waiting on an event to be written to a non-volatile (permanent or long-term) storage of the server. In some instances, the data stored in the temporary storage memory is not intended to be saved in a non-volatile storage within the server at all. In yet other embodiments, the temporary storage acts as a dynamic or quasi-instantaneous waypoint between incoming data and the non-volatile storage of the server. In some other embodiments, it is possible to share temporarily stored data between servers in a given equipment rack such that one or more servers acts as a dedicated temporary storage server and one or more servers acts as a dedicated processing server. In still other embodiments, two or more servers may share storage and computing resources in a weighted distribution. In some embodiments, storage and/or processing resources could be distributed between any number of resources within an equipment rack, between differing equipment racks, or between any other processing/storage resources within the compute service environment. In some embodiments, storage and/or processing resources may also be shared outside of the compute service environment, such as with a client computer, a third party website, or an external database, for example.

Although temporarily stored data often refers to data that has not yet been written to a non-volatile, long-term or permanent storage of a server, this may not always be the case. Some embodiments encompass data that has already been wholly or partially stored to a non-volatile, long-term or permanent storage of the server, but which has also been preserved in a temporary storage component of the server pending a further operation. Such operations could include using temporarily stored data for a computation, or transmitting/copying temporarily stored data to a different network location within or outside of the compute service environment. Additional operations could include storing an initial document in both non-volatile and temporary storage memories, and updating the initial document in the non-volatile memory with updates based on changes to the document in the temporary storage (for example, the server may periodically monitor a document in temporary storage to assess changes with respect to a document in the non-volatile storage of the server, and overwrite the document in the non-volatile storage if a discrepancy is detected—this may occur if a client is regularly revising, saving or accessing a text document in the cloud computing network).

In some embodiments, a client service request may include instructions for performing one or more computations by the server. These computations could include data processing instructions to be performed on or using information stored within the server, information that the server is able to access independently (e.g., via the internet), information stored within other components resident within the compute service environment, third party information repositories such as data bases, or from any other source or in any combination of information sources as appropriate.

As previously described, the server may store input data into a temporary storage (such as a processor cache memory, dynamic random access memory (DRAM), or static random access memory (SRAM), etc.) without saving the data into a non-volatile memory. One reason to do this may be that the server can often perform a computation more efficiently and/or quickly by avoiding the need to access the non-volatile memory regularly, which can be time consuming. In other instances, the server may periodically update one or more files in a non-volatile storage as a computational task is performed so that any interruption to the task may be resumed at the most recent iteration of the computation. Further, some computational tasks, unlike data storage, can vary indefinitely in the length of time required to perform the task without limit. For example, some tasks are purposefully programmed to run indefinitely (such as various monitoring and maintenance tasks).

If a server is unexpectedly shut down in the midst of a computational task, any number of negative consequences may be experienced once the server is powered on again. Some negative consequences of note include hard disk (or sector) errors, an unwanted safe-mode start-up, operating system (OS) file corruption, and even power supply damage. If a running task is unexpectedly interrupted, there may be no way for the server to determine where the computational task has left off. Moreover, any data required for the computational task stored in the temporary (volatile storage) memory of the server may be lost if the power unexpectedly lapses, resulting in a need for the entire computation to begin from startup. Given a best case scenario, the server may have periodically updated results of the computational task to a non-volatile storage. In this scenario, it may still be possible for the computational task to pick up where it left off prior to the lapse in external power, resulting in the retention of data.

For purposes of simplicity, service requests will be generally described as application program interface (API) requests, but it is understood that other forms of service requests can also be made. An Application Program Interface (API) request is a programmatic interface to a defined request-response message system, typically expressed in JavaScript Object Notation (JSON) or Extensible Markup Language (XML), which is exposed via the web-most commonly by means of a Hypertext Transfer (or Transport) Protocol (HTTP) based web server. Thus, in certain implementations, an Application Program Interface (API) can be defined as a set of Hypertext Transfer (or Transport) Protocol (HTTP) request messages, along with a definition of the structure of response messages, which can be in an Extensible Markup Language (XML) or JavaScript Object Notation (JSON) format. The Application Program Interface (API) can specify a set of functions or routines that perform an action, which includes accomplishing a specific task or allowing interaction with a software component. When a service receives the Application Program Interface (API) request from a client device, the service can generate a response to the request and send the response to the endpoint identified in the request.

Generally speaking, a "plug-in" includes, but is not limited to, a software component that plugs into a larger application to add functionality. When an application supports plug-ins, it can, for example, enable customization without recompilation. Additionally, in some instances, plug-ins can reduce the need for redeployment of the larger application, as functionality can be added through the plug-ins without modifying or redeploying the application itself. Some common examples are plug-ins used in web browsers to add new features such as search-engines, virus scanners, or the ability to utilize a new file type, such as a new video format.

If a server is given sufficient prior warning ahead of time that an external power supply has lapsed, a plug-in previously installed in a service or application resident in the server may dictate high priority instructions to perform various preservation tasks on the server. These tasks could include saving information stored in a temporary storage to a non-volatile storage of the server, recording the status of any running computations on the server, refusing to accept further incoming tasks, and even performing a controlled, deliberate shutdown of the server. The plug-in may also include more sophisticated functionalities such as creating and storing set points, or "snap-shots", of the overall server state, including the server's operation, memory, etc. at a given slice of time. Typically these operations would be performed once a lapse of power signal has been received by the server, but could also be performed periodically or in various combinations to achieve the best welfare for the server, its resident data, and computational state. In this way, sensitive data and calculation information in the server may be preserved, and any or all computational tasks subsequently resumed from a point nearest their unexpected termination. Additionally, the server may avoid any physical damage to its own hardware by shutting down in a predictable or predetermined manner. Of course, there are also numerous other additional benefits to avoiding a hard power shutdown than those previously described, as will be familiar to those of skill in the art.

Henceforth, all further discussion of electronic components assumes that the discussed electronic components are each resident in an individual equipment rack unless specifically stated otherwise.

A secondary, or back-up, power supply disposed either in between or in parallel with the rack components and the external power source can allow for preserving temporarily stored data, computational function status, and hardware health. In practice, there are a myriad of potential secondary power supplies capable of distributing power to the equipment rack in the event of a loss or lapse of external power. For example, external generators can provide very long-lasting secondary sources of power, but can be very large and impractical for an equipment rack, and often must be disposed well outside of the rack, causing sizable time delays to power transmission in the event of a lapse of power. Such delays can result in the unexpected shutdown of electronic rack components. Another solution is a DIN-rail mounted power supply (often referred to as MB-DIN power supplies) which can provide a direct current (DC) power buffer in the event of a lapse or transient in external power within the equipment rack. However, these power supplies can be expensive, and often provide only a short duration of power to the equipment rack (for example, on the order of 30 s or so). Part of the reason for the short-term longevity of an MB-DIN is that they are often primarily directed towards handling short-term transients in voltage and/or current. That is, an MB-DIN is not generally designed to provide a long-lasting continuous and dedicated source of electrical power in the instance of a full lapse of external electrical power to the equipment rack. MB-DIN power supplies are generally limited to 30 s or shorter depending on the model, which may not be enough time to allow the rack components (servers) to finish their various processes, store any temporary data and shut down properly. MB-DIN power supplies are also usually characterized by low power outputs, so many may be required to support an equipment rack with many servers, and even then only for short durations of time.

One of the simpler and more economical solutions for back-up power is an uninterruptible power supply (also uninterruptible power source) (UPS) that is capable of detecting a lapse in external power and automatically supplying power internally to the rack components upon detecting the external power lapse. A UPS supply can function for a relatively prolonged period of time, on the order of a few minutes or more. UPS's are also often advantageously designed to be mounted in equipment racks, and can be placed in series between the external power supply and the electronic rack components or in parallel depending on the network configuration. Typically, a series configuration is preferred, as a series configuration allows the UPS to momentarily delay the transmission of external power through the UPS. This allows the UPS to continuously supply power to the electronic rack components even when a lapse in power is detected, and use the momentary delay to begin supplying power from the UPS batteries (or other power sources associated with the UPS) without interruption. The secondary power may continue to be supplied until the UPS energy storage source(s) runs out.

An additional benefit of the UPS's more expansive power supply time window is that it is possible to provide in-rack signaling to the electronic rack components with a higher degree of likelihood that the component (server) preservation and/or shut down procedures can be successfully completed. As stated, these procedures could include preserving temporarily stored information into non-volatile storage, recording the states of various computational processes, and properly shutting down the server. The preservation functions can be initiated by a signal generated by the UPS or power shelf, and performed by one or more plug-ins, scripts, hardwired circuits, etc. on each of the servers. Furthermore, by utilizing in-rack UPS signals, the propagation time required to transmit signals between rack components are localized to much smaller physical (and thus electrical) distances. For example, loss-of-power signals need not propagate beyond the rack and into the universe of the compute service environment before being returned to the rack components (servers).

In some embodiments, it may not be necessary for the UPS's to individually transmit an output signal (beyond supplying power) to any one or more of the electronic rack components. For example, other components, sensors, or even processing algorithms may have the capability to detect that the UPS has been activated based on variations in voltages or currents. Accordingly, any such component or process may be also be able to perform in-rack communication with any of the other electronic equipment rack component independently. Thus, such components could also instantiate a self-preservation process while the UPS merely supplies internal rack power. In at least some embodiments of this disclosure, however, it is assumed that the power loss detected signal 170 originates from one or more UPS's provided in an individual rack and serving as a power monitoring component.

As previously mentioned, a UPS will frequently have a signal output separate from the UPS power output to indicate that the UPS is supplying power (e.g., in the instance of an external power lapse). In some UPS models, the signal output may be transmitted over a network cable, a relay, or may even use more advanced communication standards such as via a Wi-Fi or Bluetooth wireless output signals. Other forms of transmitting an output signal could include using standard communication components such as serial cables, co-axial cables, telephone lines, etc.

Once the UPS has detected a lapse in external electrical power, there are number of ways the loss-of-power signal could be communicated to the various electrical components in the equipment rack. For example, the UPS may send a signal over a maintenance (or console) network external to the rack via a maintenance (or console) switch, or the UPS may send a signal through a data network external to the rack via a data switch. In either instance, the signal may be returned by an external component in the form of a "magic packet" instructing some of the electronic rack components, such as server computers, to initiate a preservation and shut-down sequence. While this schema can be useful in certain instances, there are some known problems associated with the approach.

For example, both maintenance and data networks external to the equipment rack may contain high-traffic and/or noise. In the case of an external (out-of-rack) management network, there may be a large number of queries, pings, and/or other data collection or monitoring messages being passed between components in the compute service environment (including in-rack components). In contrast, sending maintenance commands/queries (including loss-of-signal messages) through the data network can occupy valuable client bandwidth. In both cases, it would be faster to avoid any out-of-rack communication signaling, and instead convey the loss-of-power signal directly to and from components within the rack. By confining the loss-of-power signal to the equipment rack, external interference/influence can be almost entirely eliminated. Additionally, if the loss-of-power signal could be isolated from all other signals, there would be little or no impact on the existing management or data bandwidth to or from the rack. The result would be a loss-of-power signal that does not necessarily leave the confines of the rack, and which in some embodiments is confined exclusively to the rack components. An in-rack network would provide little to no interference with the existing rack communication networks, and would be communicated over a highly-robust, highly resilient in-rack network largely independent of external network influences. Accordingly, this power loss detected signal could be quickly and efficiently communicated to any rack component.

In an "in-rack" network environment, there are numerous configurations that could be used to communicate the power loss detected signal between the various rack components to instantiate preservation and safe shutdown procedures. For example, a UPS may use a signal port connected between the UPS and each server in the equipment rack through a signal bus bar to relay the power loss detected signal to each server individually. While this approach can be effective, numerous practical considerations can also make this approach both difficult and costly. For example, each component in the rack would have to have a direct signal connection with the UPS (in addition to the power connection) through the signal bus bar, which would require an additional cable (one per component to the signal bus bar), which could increase costs, and may require installation and maintenance of a signal bus bar if one is not already present. Alternatively, each rack could be equipped with an isolated, dedicated switch for the power loss detected signal; however, this would also require an additional cable per component (through the switch) and additionally a switch to be added to each rack to support this functionality. Both approaches would increase both the complexity and cost, including an increased number of cables per rack, modification to the rack architecture, etc. Additionally, neither of these solutions are particularly robust, since the number of potential points of failure (e.g., the number of connections, cables, etc. that could exhibit a fault) is larger.

An alternative solution is that the UPS could transmit the power loss detected signal to one or more (but not all) of the electrical components in the rack, and rely on individual connections between the rack components to retransmit the signal. This approach, however, has its own set of separate drawbacks. Because rack components generally communicate with one another via a management or data switch in (or external two) the rack, extra cabling would still be necessary between the rack components to piggyback the initial power loss detected signal 170 from the UPS in a timely fashion. Additionally the power loss detected 170 signal would incur a time delay as it propagates through the various rack components. Servers would also likely require re-configuration to dedicate ports, and (as before) if a rack component experiences a fault, the piggybacked signal may proceed no further than the "weakest link" component.

Another solution is illustrated in an embodiment represented in FIG. 1. In FIG. 1, an equipment rack 100 is depicted. One or more UPS 105 units are housed in one or more power shelves 110. When a UPS 105 detects a loss of external power, a "power loss detected" signal 170 is sent from the UPS 105 (or an alternative component within the power shelf 110) to a management switch 130. The power loss detected signal 170 is then retransmitted by (or through) the management switch 130 to each of the rack servers 120_1-120_N, in addition to any other electronic components in the rack 100 that it would be desirable to convey this information to. The means in which this is accomplished, and some of the advantageous aspects of this approach, are discussed in greater detail below. Additionally illustrated in FIG. 1 are management/server network cables 150 capable of relaying messages between the management switch 130 and servers 120_1-120_N.

In FIG. 1, a data switch 140 is shown at the top of the equipment rack 100 above the management switch 130, which is in turn above the servers 120_1-120_N (in addition to most of the remaining rack equipment except for the power shelf 110) until reaching the (one or more) power shelve(s) 110. Often, the power shelf 110 components are the heaviest individual components because they can include industrial grade batteries and power circuitry, etc. Thus, power shelf components are usually desired to be at or as near to the bottom of the equipment rack 100 for equilibrium and stability, in addition to the fact that external power sources are usually most accessible nearest to the floor. The power shelf 110 is also often connected to a power bar 190 that is capable of supplying back-up power from the power shelf 110 to each of the electronic rack components such as servers 120_1-120_N, in addition to any of the management switch(es) 130, data switch(es) 140, and/or any other of the electronic rack 100 components.

As will be well known to one of skill in the art, this is a frequently used configuration for an equipment rack as it standardizes component placement, with data passing through the data switch 140 at the top and trickling down to or up from any processing or storage nodes (e.g. servers 120_1-120N) below. Often, the data switch 140 is a high quality, high speed switch, and is frequently connected to numerous other equipment racks (not shown) having the same or similar rack architectures, creating an extra-rack network within the compute service environment. In some configurations, data to/from each of the networked equipment racks is aggregated at higher hierarchical layers to other, even higher capacity switches/servers within the compute service environment, which are themselves in turn connected with even higher performance switches/servers at further hierarchical aggregation layers in accordance with the architecture of the compute service environment. The hierarchical aggregation of data can resemble an upside-down tree-like structure with the equipment racks representing the lowest layers of data aggregation (leaves) and the higher layers representing branches of increasing data aggregation/capacity as the tree is traversed from a leaf towards the trunk.

In this disclosure, the data being passed between in-rack data switch(es) 140 and servers 120_1-120_N is principally considered to be user-related data, such as information to be stored, requested, or processed. This information is usually conveyed to and from the rack 100 network components via the data switch 140, often through network cables (not shown for simplicity) independently connected between the data switch 140 and each of the individual rack 100 electronic components (e.g. servers 120_1-120_N). Conversely, data passed between one or more management switches 130 and servers 120_1-120_N is usually considered to be related to management and/or administrative data services that are not usually accessible to a client of the service provider. As previously stated, such services may include collecting and tabulating information regarding component performance, quality of service, pinging, etc. These statistics can be used to inform the service provider if various contractual performance metrics are being met, provided to one or more clients of the service provider, or for any other evaluative, data collective or diagnostic purpose, etc.

In FIG. 1, if a lapse in external power is detected, a power loss detected signal 170 is transmitted to a management switch 130 via a network cable 160 from the power shelf 110. A circuit board residing in the management switch 130 (which may or may not be integral with the motherboard of the management switch 130) may intercept the power loss detected signal 170 and the power loss detected signal(s) relayed 180.

As previously stated, one method of performing this function could be to provide individual network cables for each network component (server) between the given server 120_1-120_N and the management switch 130, or (as previously discussed) piggybacking the relayed power loss detected signal(s) 180. However, this approach would suffer the same deficiencies as providing a direct communication between the power shelf 110 and the individual servers 120_1-120_N with the only difference being that the signal is now branched from the management switch 130 rather than from the power shelf 110.

It would be more advantageous to utilize existing network cable connections within the rack 100 without impeding the flow of management or client data. In some network cables, such as RJ-45 or RJ-11 network cables, numerous conductors are bundled into a single network cable or cord. This can make a network cable more versatile, because the cable can be used in a plurality of different performance environments. For example, an RJ-45 network cable can be used to support CAT-5, CAT-5E, CAT-6, etc.; each of these standards may be used to support differing data rates and/or performance requirements. Each of these standards may also require differing numbers of conductors to meet a specified standard, such as data rate. Accordingly, it is not unusual for a given network cable to house unused, redundant, or reserve conductors. Although we have only mentioned RJ-45 and RJ-11 network cables, the same may be true for any given cables such as a serial communication cable, FireWire cable, or any other form of "direct-connect" cable. The same principle could also hold for WiFi or Bluetooth "dongles" that connect directly to a rack component at each end but perform wireless communication in between. Accordingly, if a network cable houses conductors that are not in use, these conductors may be purposed for other forms of functionality. In some cases, if the unused conductors are exclusively unused (e.g., they aren't used "occasionally", or "only in case of emergency"), they can be very reliably isolated from the other data carrying network cable conductors. By utilizing these previously unused conductors, their pre-existing, unused connections between rack components can be augmented for a useful purpose, such as to become dedicated communication channels through which signals (such as a loss-of-power signal) may be sent. This would advantageously have little or no impact on information already being communicated through the remaining network cable conductors with the exception of a small degree of cross-talk.

Figure 2:
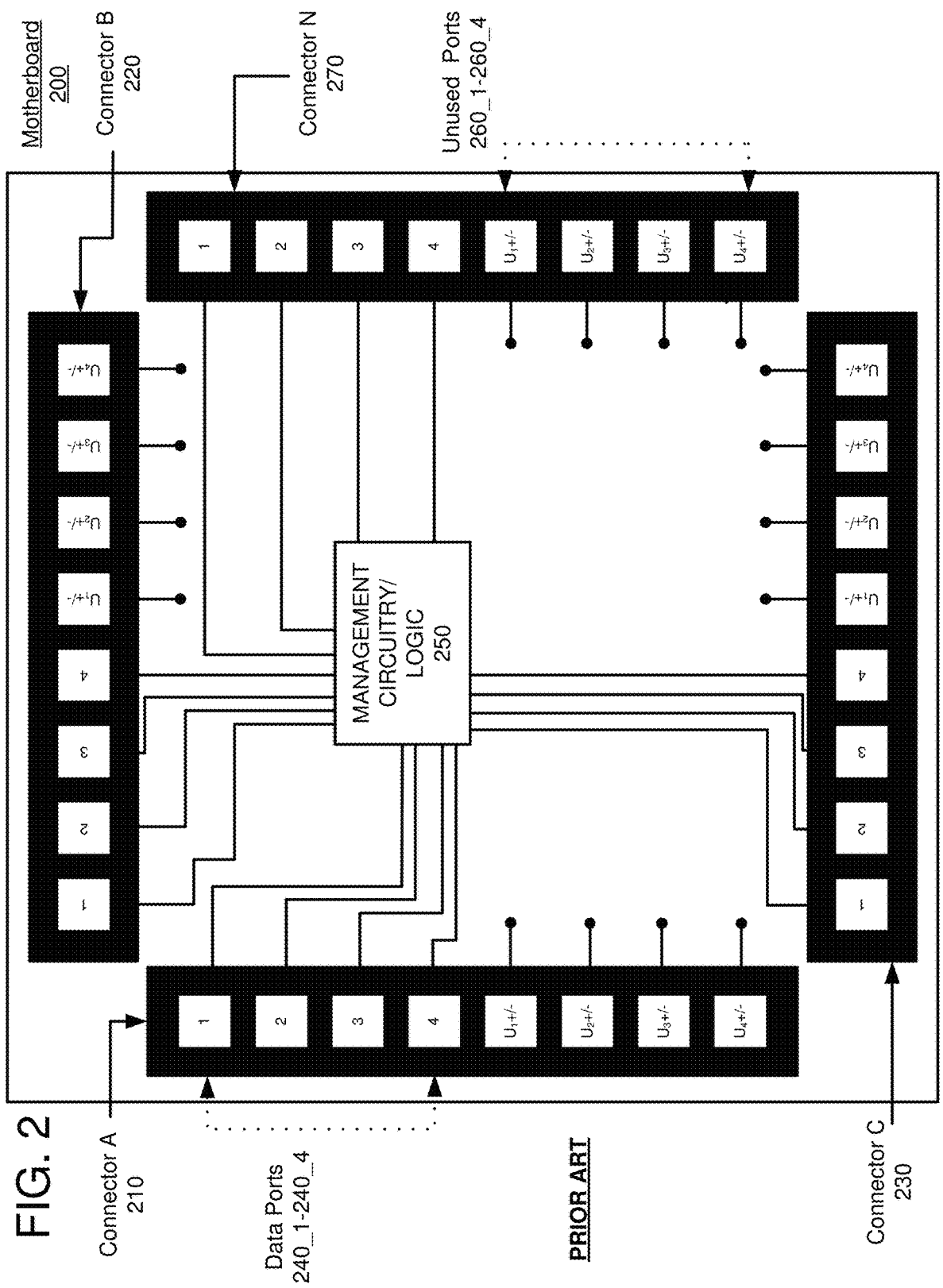
FIG. 2 depicts an example implementation of a management switch circuit/mother board.

FIG. 2, for example, illustrates a motherboard 200 including management circuitry/logic 250 capable of supporting numerous independent network cable connections A-N (in this exemplary case, N=4 for simplicity). It is noted that, although the motherboard 200 is labeled as a motherboard, this is a generalization as the motherboard 200 could comprise any generalized circuit board resident on, near, or coupled to the motherboard 200 in the management switch 130.

In the embodiment illustrated in FIG. 2, four conductors from each connector A 210, connector B 220, and connector C 230 through connector N 270 are used for data and four are unused, although the exact number of used and unused conductors is arbitrary. In FIG. 2, the data port connections 240_1-240_4 are labeled as "1" through "4". The unused port connections 260_1-260_4 are labeled "$U_{1+/-}$" through "$U_{4+/-}$" ("U" for unused; the +/− referring to single or differentially transmitted signals of either polarity). Although each network cable connection is depicted as having eight conductors each, one of skill in the art will readily realize that any number of various connectors with any number of used or unused conductors may be readily substituted into this theoretical model without restriction.

A service provider may elect to ignore the unused conductors $U_{1+/-}$ through $U_{4+/-}$ in connectors A-N as illustrated in FIG. 2. One reason for this may be that a certain communication data rate standard requires only a predetermined number of conductors such as 240_1-240_4; thus, the leftover conductors may serve as a reserve for future applications, newer data communications standards (such as higher data rates or less noise with the addition of more contributing conductors), or for anything else. In some instances, it may simply be practical to ignore the unused $U_X$ conductors if commercial, off the shelf (COTS) equipment has already been purchased or installed which does not comply with a communication standard that the service provider can realistically provide.

For example, network switches operating on the order of 100 MB/s often only require four conductors to meet the 100 MB/s communication standard, whereas a switch operating at 1 GB/s usually requires eight. In some instances, it may be in the interest of a service provider to run a switch at a lower data rate if clients of the service provider have not subscribed to a faster service package. Alternatively, it may be preferable to operate switches in the compute service environment at a lower data rate to conserve power, for instance, if the service provider's clients do not regularly require a switching rate that exceeds a particular data rate.

Since each of the connectors A-N each represent a cable that natively houses eight conductors (arbitrarily) with four data ports 240_1-240_4, the unused ports 260_1-260_4 may be used for other purposes. More specifically, and as intentionally illustrated in FIG. 2, the unused ports to 260_1-260_4 can be used for any form of functionality or process that will not interrupt or interact with the data ports 260_1-260_4 due to the lack of electrical connectivity between the data ports 240_1-240_4 and the unused ports 260_1-260_4. Thus, the unused ports 260_1-260_4 can take advantage of unused network cable bandwidth without impacting the management data bandwidth. That is, and referring to FIG. 1, the unused conductors can be utilized or "hijacked" to relay the power loss detected signal 170 into power loss detected signals(s) relayed 180 using existing cables on the unused conductors $U_{1+/-}$ through $U_{4+/-}$ on each connector A-N cable with no need for additional cabling or complexity. The only requirement for performing this functionality is a redesign of the motherboard 200, or an addition of a circuit board to the motherboard 200 that connects at least some of the unused conductors $U_{1+/-}$ through $U_{4+/-}$ between differing connectors A-N in a useful way (and with the possible addition of additional circuitry or logic).

Figure 3:
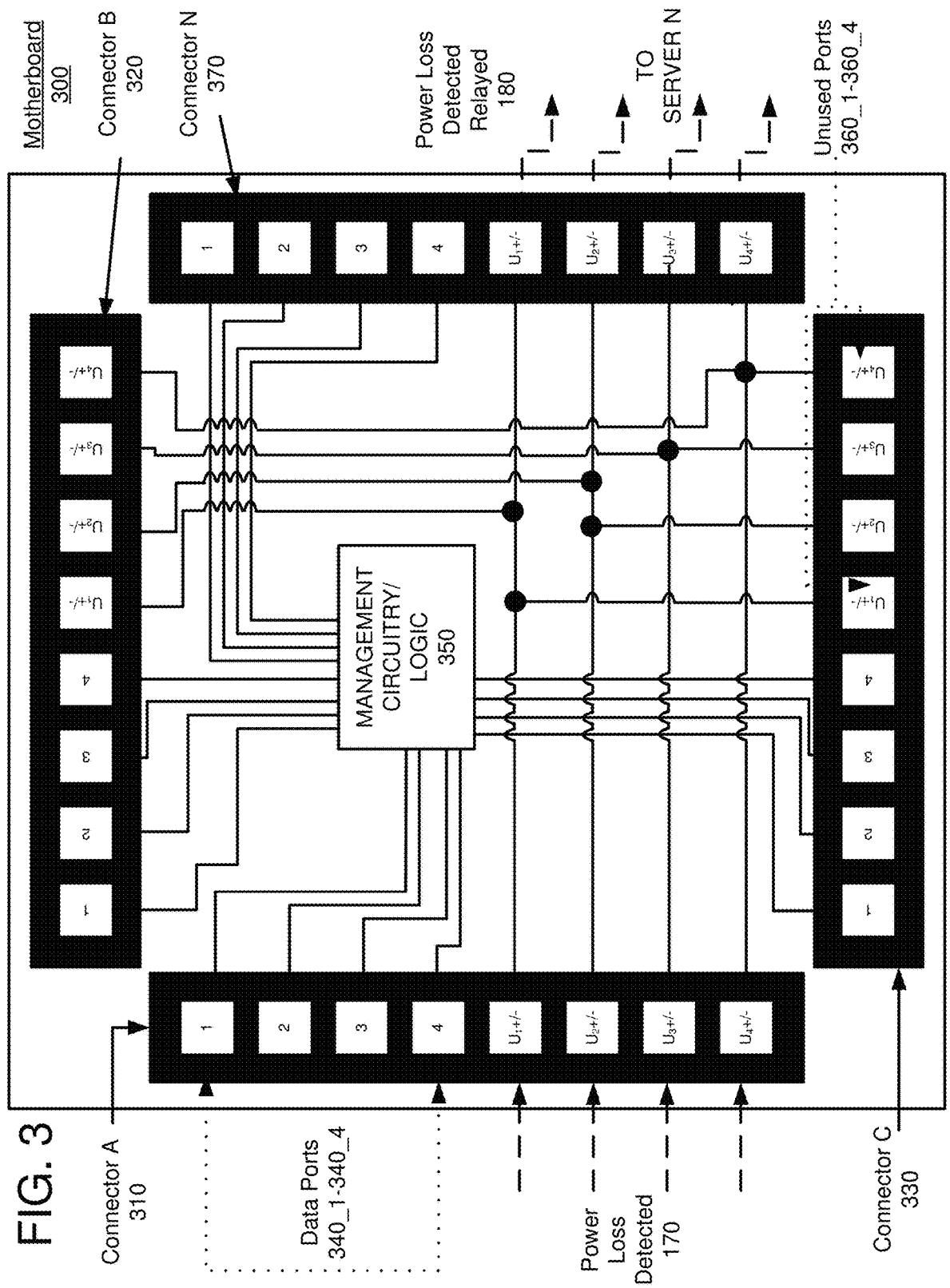
FIG. 3 depicts a management switch circuit/mother board in accordance with an exemplary embodiment.

FIG. 3 depicts an embodiment in which a power loss detected signal 170, originating from the power shelf 110, could be used to alert other rack components to initiate preservation and/or shutdown procedures to avoid damaging software and/or hardware assets (including server 120_1-120_N assets). In FIG. 3, the power loss detected signal 170 is carried by connector A 310 over four distinct conductors $U_{1+/-}$ through $U_{4+/-}$ (although only one conductor $U_X$ is required in principle), propagated through the motherboard 300, and relayed by the motherboard 300 over connector N 340 as the power loss detected signal(s) relayed 180 to a server 120_N. It is noted that the same (partner) conductors have been tied together (e.g., $U_{1+/-}$ on connector A 310 to $U_{1+/-}$ on connector N 340, and so forth), though this needn't be the case. One of skill in the art will also recognize that the signals carried by $U_{1+/-}$ through $U_{4+/-}$ in the embodiment as illustrated would also replicated at the same conductors $U_{1+/-}$ through $U_{4+/-}$ on connectors B and C.

Assuming that the connectors B-N are connected to one or more of the servers 120_1-120_N, the power loss detected signal 170 can propagate to any or all of the servers 120_1-120_N and trigger a preservation/shutdown procedure. Once a server has detected this signal, a plug-in or other form of code or script could instruct the server to save any temporary data into a nonvolatile storage of the server, to evaluate and record the status of any ongoing computations, to take a snapshot of any or all of the servers attributes, and/or to shut down the server in a controlled fashion once the preceding tasks have been completed. The preservation/shutdown functionality (without adding additional components or cables or by sacrificing bandwidth) is accomplished purely through the "hijacking" of unused network cable conductors.

In an embodiment, the power loss detected signal 170 may require only a single wire. This may occur for a simple GPIO signal, such as a resistive pull up or pull down voltage signal that is detectable relative to a ground on the cable, in the equipment rack, or an earth ground. Because only one conductor is required (in principle), it may be desirable to use any number of other network cables in relaying the power loss detected signal 170 to servers 120_1-120_N. For example, if 8 conductors are required for a 1 GB/s signal, a hypothetical nine (or more) conductor cable could provide 1 GB/s functionality while also conveying the power loss detected signal 170 to the servers 120_1-120_N without sacrificing the 1 GB/s data rate.

In some embodiments, it may be desirable to use more than one conductor to relay the power loss detected signal 170. For example, either the UPS 105 or the power shelf 110 could dispatch a power loss detected signal 170 differentially between two conductors, such as $U_1$ and $U_2$. The signal could be interpreted in a myriad of ways. In some embodiments, a server may detect the signal by detecting a change in an open or short circuit between the conductors $U_1$, $U_2$ coming from the UPS 105 or the power shelf 110. Similarly the server may detect that a voltage or current has changed between the conductors $U_1$, $U_2$. In some embodiments, three or more conductors could be used based on any pre and/or post-processing circuitry or logic, such as in a managed or unmanaged network protocol signal such as a TCP/IP, UDP, HTTP, HTTPS, FTP, SSH, IMAP, or any other protocol as would be known to one of skill in the art.

As depicted in FIG. 3, the most basic requirement for achieving this functionality is a modification to the trace circuitry in the management switch 130; and more specifically to the motherboard 300 or some circuit board resident on or integral to the motherboard 300. While only two of the unused conductors 360 have been principally referenced, it should be clear to one of skill in the art that there may be utility in using only a single of the previously unused conductors up to all of the previously unused conductors depending on network architecture, cable type, etc. In some embodiments with two or more UPS 105 units, it may be advantageous to also utilize the $U_3$ and $U_4$ conductors coming from the power shelf 110. One reason for doing this could be for an additional layer of fault tolerance; e.g., if one UPS 105 fails to trigger (or falsely triggers), it may require maintenance. Additionally (and as briefly described above) a more sophisticated communication scheme (such as a managed network protocol alerting system) may require the use of each of the four previously unused conductors for signals in each connector such as for signals TD(A/B)+, TD(A/B)−, RD(A/B)+ and RD(A/B)− as may be found in a duplex (A→B or B→A) RS422 serial communication link. Of course, any other combination of signal distribution may also be possible depending on the system architecture.

Figure 4:
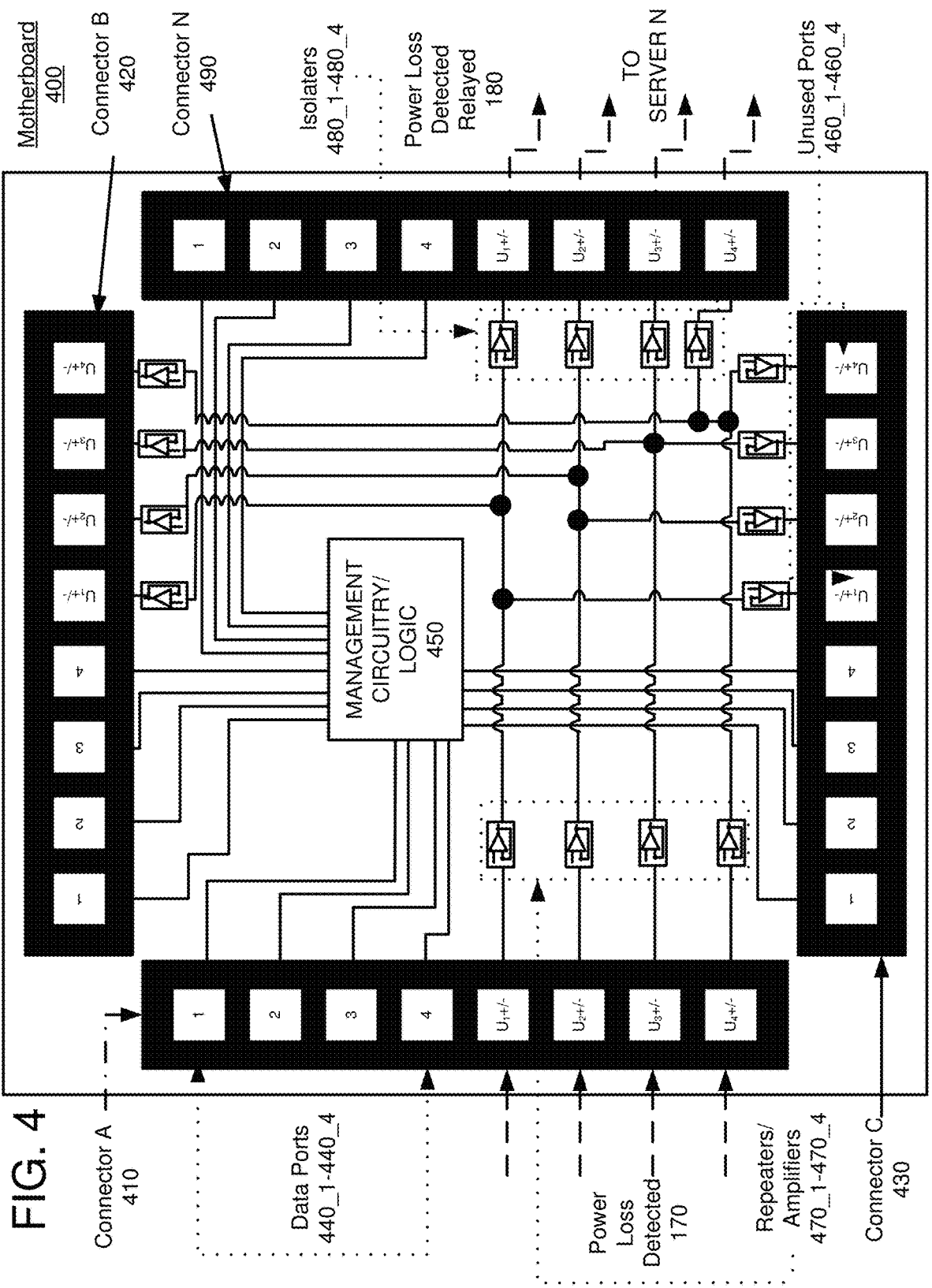
FIG. 4 depicts a management switch circuit/mother board in accordance with an exemplary embodiment.
Figure 5:
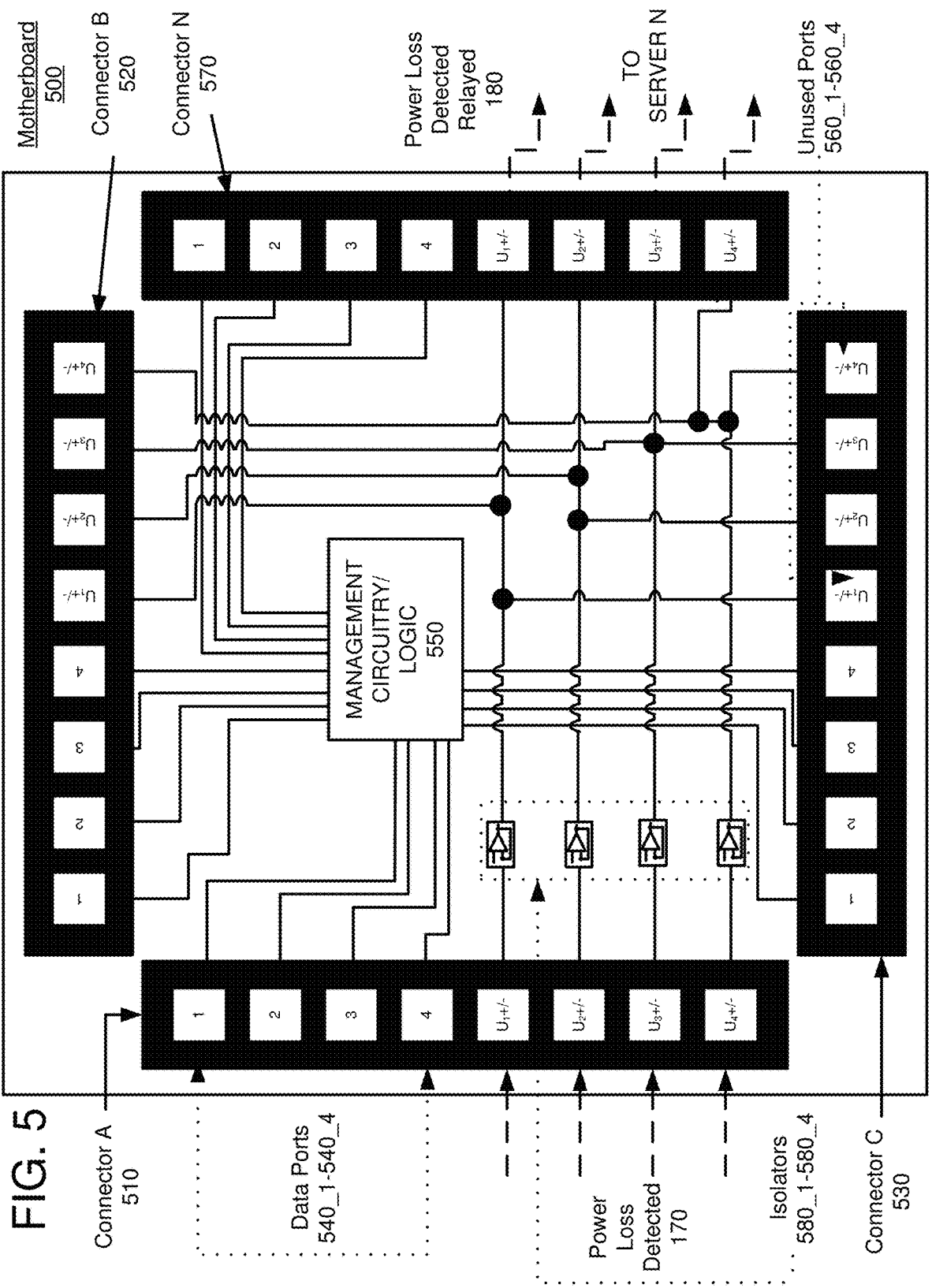
FIG. 5 depicts a management switch circuit/mother board in accordance with an exemplary embodiment.

FIG. 4 depicts a slightly more complex design embodiment in which components such as repeaters/amplifiers 470_1-470_4 are used in conjunction with isolators 480_1-480_4 resident on each of the connectors B 420 through N 490 (although only the connector N 490 isolators are labeled). Although the symbols are identically drawn, they need not represent the same component. A repeater 4701, for example, may be used to amplify and repeat an incoming signal from the power shelf 110, while an isolator 480_1, for example, may keep downstream components such as servers 120_1 from surging currents, transient currents or voltages, etc. In the case of a resilient in-rack network as described above, it may not be necessary to amplify the power loss detected signal 170 by replacing the 470_1-470_4 repeaters/amplifiers (as depicted in FIG. 5) with isolators 580_1-580_4 to protect the servers 1-N from unpredictable current/voltage fluctuations. Additionally, management circuitry/logic 450, connector C 430, connector B 420, connector N 490, and data ports 440_1-440_4 are additionally illustrated.

As described above, FIG. 5 illustrates a configuration of the motherboard 500 with sole isolators 580_1-580_N at the outputs of the A connector's $U_X$ conductors. As stated, the isolators 580_1-580_N can help manage unwanted spikes in voltages or currents transmitted to the servers 1-N, and may also serve to maintain the line voltages on each $U_X$ conductor before any signal (wanted or unwanted) is sent downstream to the servers 120_1-120_N. While the isolators 580_1-580_N (also known as repeaters) may comprise basic Op-Amp circuits (as illustrated), isolators in general can be extremely varied in implementation and application, and may range from analog to optical with a great range in both cost and functionality.

In some embodiments (not illustrated), the isolation stages 580 may be restricted to the output of the power shelf 110 connector A on the motherboard 500. In these embodiments, the isolated signals are simply shorted to the destination conductor $U_X$ cables B-N after isolation, thus saving cost, space, and power. However, in this instance, faults in any one of the isolators 580 could affect multiple downstream servers 1-N in the event of a power surge on any of the conductors $U_X$ with a faulty or damaged isolator 580.

Figure 6:
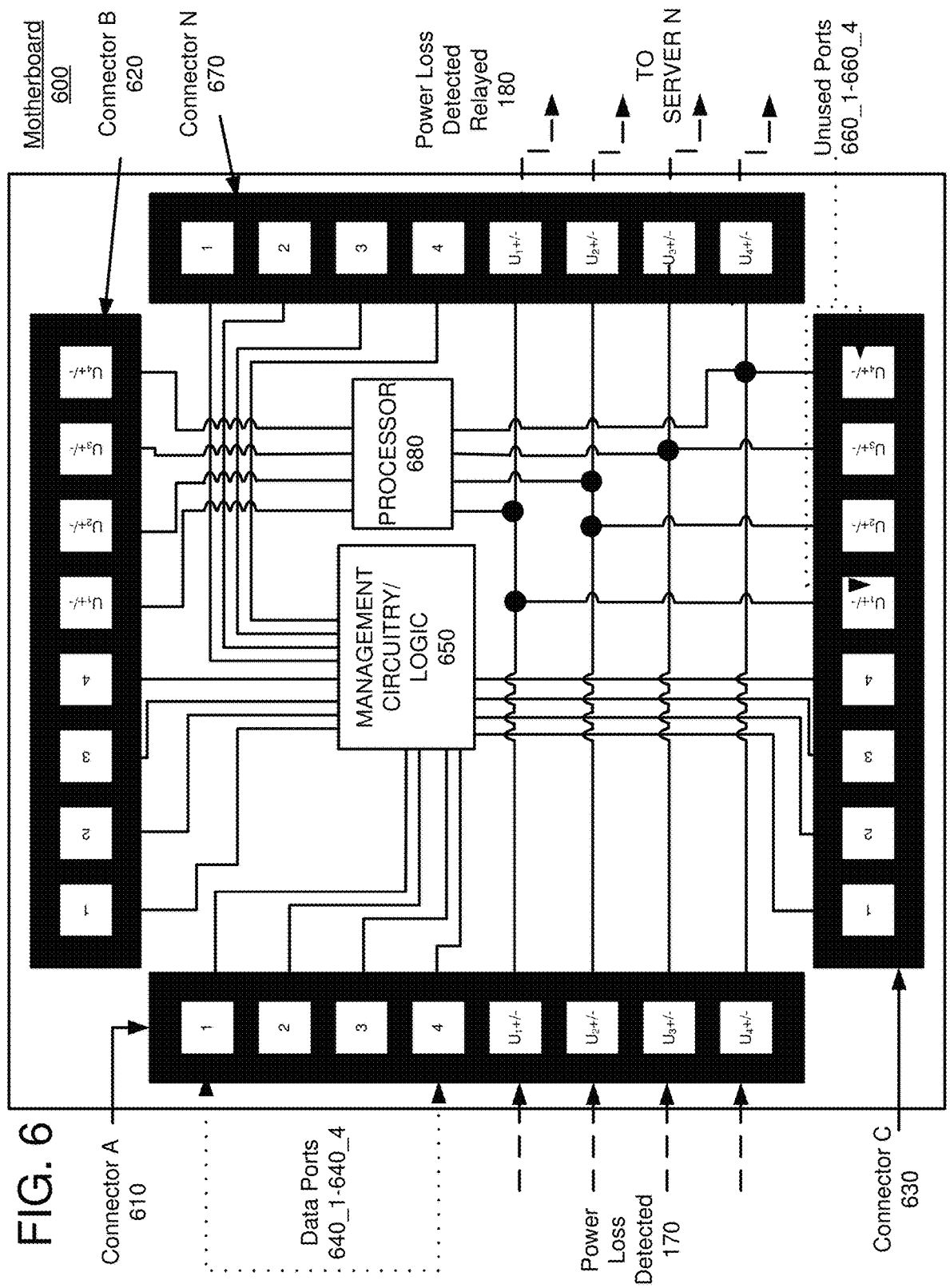
FIG. 6 depicts a management switch circuit/mother board in accordance with an exemplary embodiment.

FIG. 6 illustrates an alternate embodiment in which a separate processor 680 handles the power loss detected signal 170. In FIG. 6, the power loss detected signal 170 may originate as a simple GPIO signal (such as a push-pull resistive circuit) or as a managed or unmanaged network protocol packetized digital signal. As will be well known to those of skill in the art, the exact nature of the incoming signal is largely irrelevant since the processor 680 can be configured to recognize any sequence of input events and generate any sequence of output events in response to the input events. Some advantages of using a processor 680 are that some of the previously disclosed features such as amplification and isolation can be handled (to a degree) by the processor 680. Additionally, the processor 680 can perform additional functions such as performing line and component tests exclusively on the in-rack network. Additionally, a processor 680 could awake UPS 105 batteries that were otherwise dormant (e.g., the first battery acts as a shift watchman and consecutive batteries are called in the event of a lapse in power). Furthermore, the processor 680 can dispatch alerts to components in other equipment rack, to other equipment in the compute service environment, or even beyond the cloud computing resource to deliver email, text, or other notifications of failure, metrics, etc. In some embodiments, the processor 680 may re-route a remote UPS to compliment the in-rack UPS 105.

Figure 7:
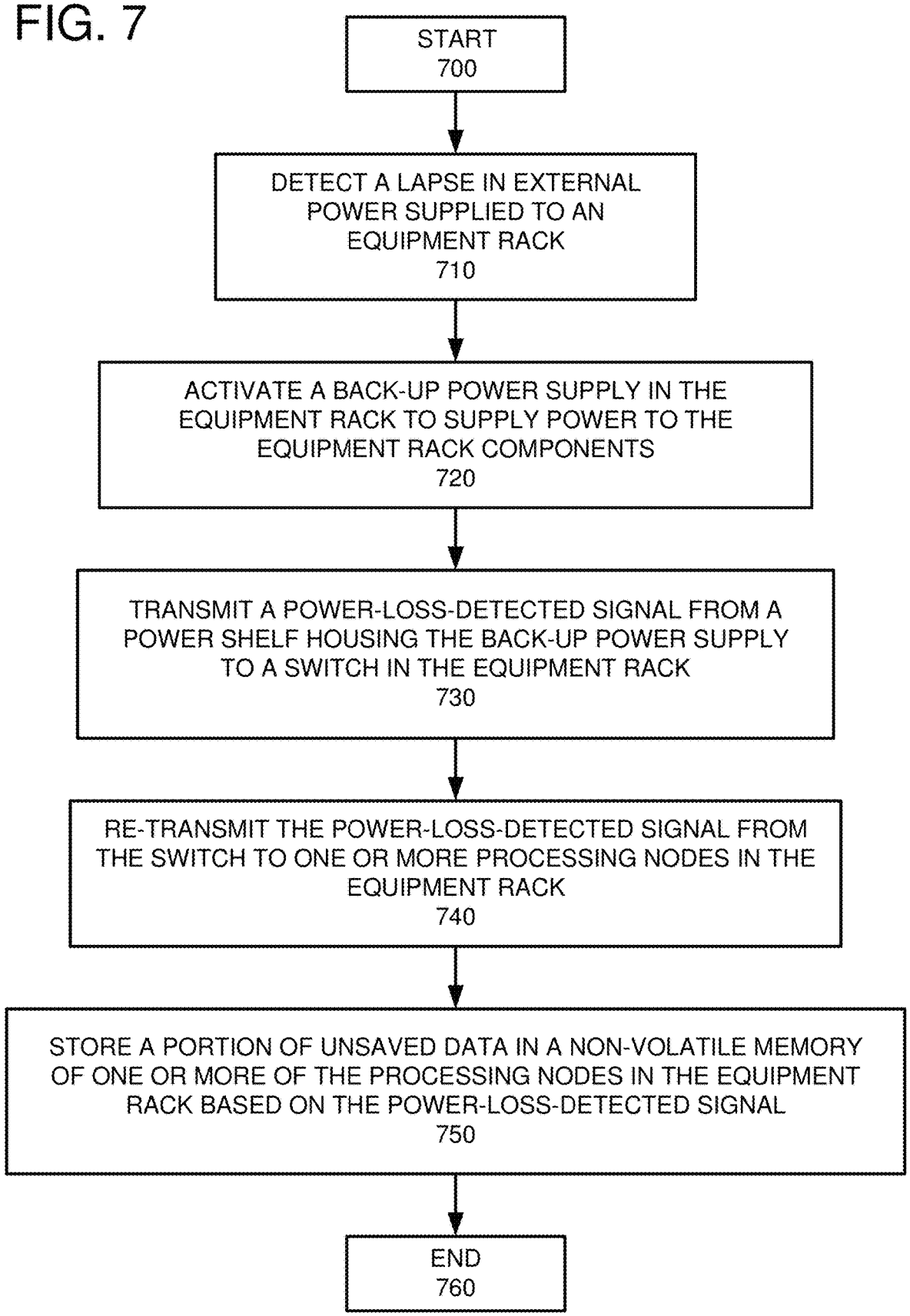
FIG. 7 depicts a flowchart of a process in accordance with an exemplary embodiment.

FIG. 7 depicts a flowchart consistent with certain embodiments of the claimed invention. In FIG. 7, the process starts at process block 700 and proceeds to process block 710, where a lapse in external power supplied to an equipment rack is detected by a back-up power supply such as UPS 105. The process then proceeds to process block 720, where the back-up power supply in the rack is activated to supply a temporary source of internal rack power to the rack components. The process then proceeds to process block 730, in which the back-up power supply (or another component, such as a power shelf housing the back-up power supply) transmits a loss-of-power detected signal to a switch in the equipment rack. Often, this switch will be a management or console switch (as opposed to a network data switch). At process block 740, the loss-of-power detected signal is relayed through the switch to one or more processing nodes (e.g., servers) in the equipment rack. As previously described, this can be done using existing network cables housing one or more unused conductors for cost and efficiency without adding to the network complexity of the rack. At process step 750 some or all of any unsaved data (including data relating to ongoing processing operations or functions) are saved into a non-volatile memory of the processing node (e.g. server) so that the data will be preserved in the case of an unexpected shutdown of internal rack power (e.g., the UPS batteries run out). The process ends at the "END" process block 760.

Figure 8:
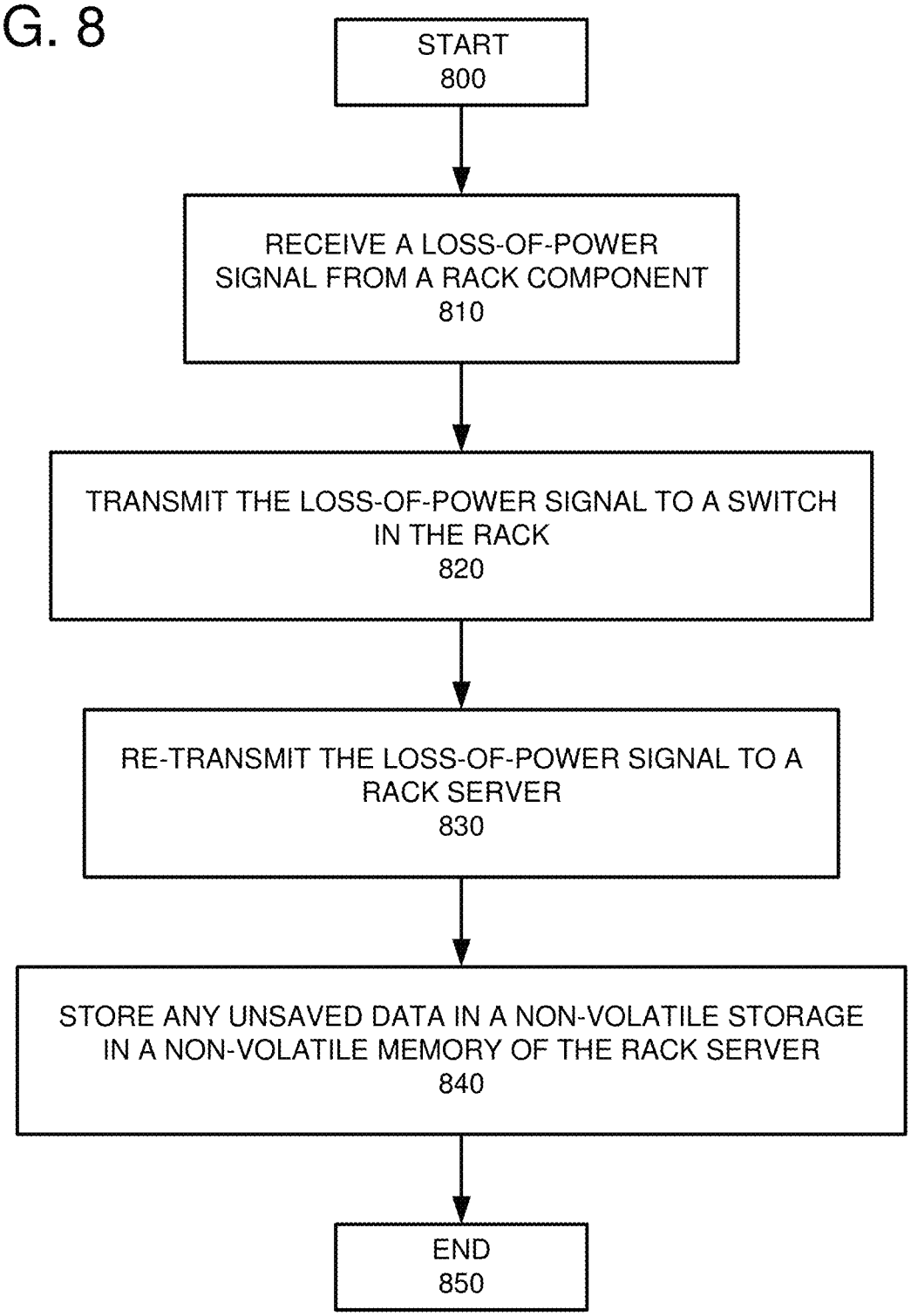
FIG. 8 depicts a flowchart in accordance with another embodiment of an exemplary embodiment.

FIG. 8 depicts a flowchart consistent with some other embodiments of the disclosure. In FIG. 8, a process begins at the "START" process block 800 and proceeds to process block 810, where a loss-of-power signal is detected by a component resident in an equipment rack. At process 820, the loss-of-power signal is transmitted by the component to a switch in the equipment rack. As previously stated, existing network cables with unused conductors could be used to transmit the loss-of-power signal to the switch. At process block 830, the loss-of-power signal may be-transmitted to a server in the equipment rack. This may also be accomplished using unused conductors resident in existing network cables having existing cable connections between the switch and the server. At process block 840, the server takes actions to store any unsaved (temporarily stored) data into a non-volatile memory of the rack server in anticipation of an unexpected power loss to the server. As previously described, unstored data may include but is not limited to raw data, computational function status, etc. The process ends at process block "END" 850.

Figure 9:
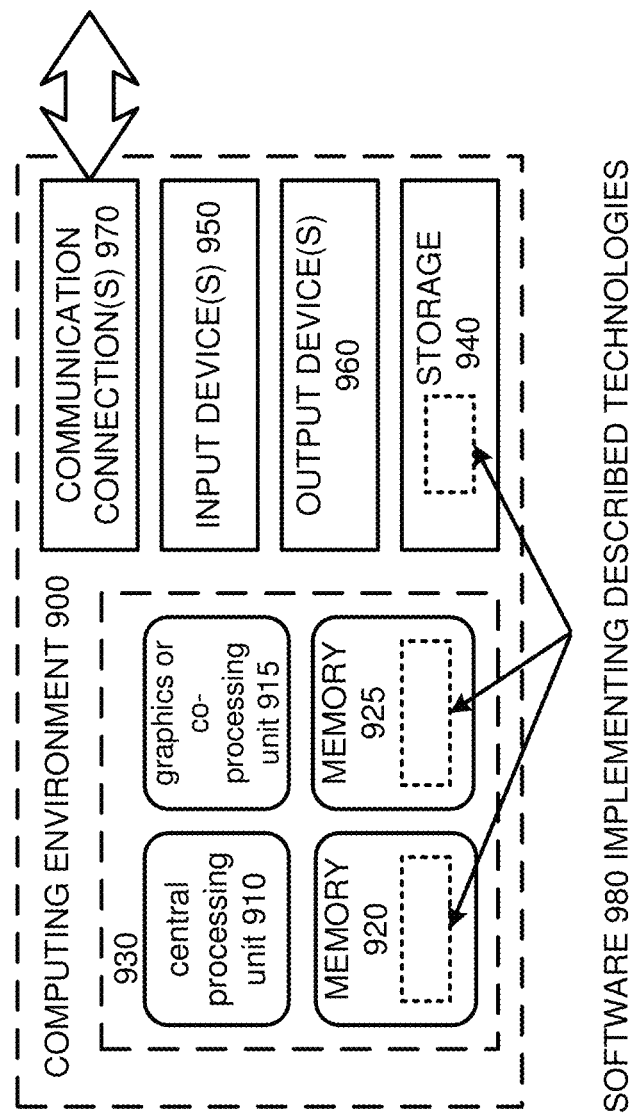
FIG. 9 depicts a computing environment in accordance with an exemplary embodiment.

FIG. 9 depicts a generalized example of a suitable computing environment 900 in which the described innovations may be implemented. The computing environment 900 is not intended to suggest any limitation as to scope of use or functionality, as the innovations may be implemented in diverse general-purpose or special-purpose computing systems. For example, the computing environment 900 can be any of a variety of computing devices (e.g., desktop computer, laptop computer, server computer, tablet computer, smart phone etc.).

With reference to FIG. 9, the computing environment 900 includes one or more processing units 910, 915 and memory 920, 925. In FIG. 9, this basic configuration 930 is included within a dashed line. The processing units 910, 915 execute computer-executable instructions. A processing unit can be a general-purpose central processing unit (CPU), processor in an application-specific integrated circuit (ASIC) or any other type of processor. In a multi-processing system, multiple processing units execute computer-executable instructions to increase processing power. For example, FIG. 9 shows a central processing unit 910 as well as a graphics processing unit or co-processing unit 915. The tangible memory 920, 925 may be volatile memory (e.g., registers, cache, RAM), non-volatile memory (e.g., ROM, EEPROM, flash memory, etc.), or some combination of the two, accessible by the processing unit(s). The memory 920, 925 stores software 980 implementing one or more innovations described herein, in the form of computer-executable instructions suitable for execution by the processing unit(s).

A computing system may have additional features. For example, the computing environment 900 includes storage 940, one or more input devices 950, one or more output devices 960, and one or more communication connections 970. An interconnection mechanism (not shown) such as a bus, controller, or network interconnects the components of the computing environment 900. Typically, operating system software (not shown) provides an operating environment for other software executing in the computing environment 900, and coordinates activities of the components of the computing environment 900.

The tangible storage 940 may be removable or non-removable, and includes magnetic disks, magnetic tapes or cassettes, CD-ROMs, DVDs, or any other medium which can be used to store information in a non-transitory way and which can be accessed within the computing environment 900. The storage 940 stores instructions for the software 980 implementing one or more innovations described herein.

The input device(s) 950 may be a touch input device such as a keyboard, mouse, pen, or trackball, a voice input device, a scanning device, or another device that provides input to the computing environment 900. The output device(s) 960 may be a display, printer, speaker, CD-writer, or another device that provides output from the computing environment 900.

The communication connection(s) 970 enable communication over a communication medium to another computing entity. The communication medium conveys information such as computer-executable instructions, audio or video input or output, or other data in a modulated data signal. A modulated data signal is a signal that has one or more of its characteristics set or changed in such a manner as to encode information in the signal. By way of example, and not limitation, communication media can use an electrical, optical, RF, or other carrier.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed methods can be used in conjunction with other methods.

Any of the disclosed methods can be implemented as computer-executable instructions stored on one or more computer-readable storage media (e.g., one or more optical media discs, volatile memory components (such as DRAM or SRAM), or non-volatile memory components (such as flash memory or hard drives)) and executed on a computer (e.g., any commercially available computer, including smart phones or other mobile devices that include computing hardware). The term computer-readable storage media does not include communication connections, such as signals and carrier waves. Any of the computer-executable instructions for implementing the disclosed techniques as well as any data created and used during implementation of the disclosed embodiments can be stored on one or more computer-readable storage media. The computer-executable instructions can be part of, for example, a dedicated software application or a software application that is accessed or downloaded via a web browser or other software application (such as a remote computing application). Such software can be executed, for example, on a single local computer (e.g., any suitable commercially available computer) or in a network environment (e.g., via the Internet, a wide-area network, a local-area network, a client-server network (such as a cloud computing network), or other such network) using one or more network computers.

For clarity, only certain selected aspects of the software-based implementations are described. Other details that are well known in the art are omitted. For example, it should be understood that the disclosed technology is not limited to any specific computer language or program. For instance, the disclosed technology can be implemented by software written in C++, Java, Perl, any other suitable programming language. Likewise, the disclosed technology is not limited to any particular computer or type of hardware. Certain details of suitable computers and hardware are well known and need not be set forth in detail in this disclosure.

It should also be well understood that any functionality described herein can be performed, at least in part, by one or more hardware logic components, instead of software. For example, and without limitation, illustrative types of hardware logic components that can be used include Field-programmable Gate Arrays (FPGAs), Program-specific Integrated Circuits (ASICs), Program-specific Standard Products (ASSPs), System-on-a-chip systems (SOCs), Complex Programmable Logic Devices (CPLDs), etc.

Furthermore, any of the software-based embodiments (comprising, for example, computer-executable instructions for causing a computer to perform any of the disclosed methods) can be uploaded, downloaded, or remotely accessed through a suitable communication means. Such suitable communication means include, for example, the Internet, the World Wide Web, an intranet, software applications, cable (including fiber optic cable), magnetic communications, electromagnetic communications (including RF, microwave, and infrared communications), electronic communications, or other such communication means.

The disclosed methods, apparatus, and systems should not be construed as limiting in any way. Instead, the present disclosure is directed toward all novel and nonobvious features and aspects of the various disclosed embodiments, alone and in various combinations and subcombinations with one another. The disclosed methods, apparatus, and systems are not limited to any specific aspect or feature or combination thereof, nor do the disclosed embodiments require that any one or more specific advantages be present or problems be solved.

In view of the many possible embodiments to which the principles of the disclosed invention may be applied, it should be recognized that the illustrated embodiments are only examples of the invention and should not be taken as limiting the scope of the invention.

What is claimed is:

1. A method for preserving unsaved data to a server in an electronic equipment rack in the event of an external power outage, the method comprising:

detecting, by an uninterruptable power supply (UPS) housed in a power shelf in the rack, a lapse in external power being delivered to the rack;

activating the UPS power supply to supply power to a management switch in the rack and the server, wherein the management switch is coupled to the server using a network cable;

transmitting messages between the management switch and the server using the network cable, wherein the messages relate to performance metrics of the server;

transmitting a power-loss signal from the power shelf to the management switch indicating that a loss of external power has occurred;

re-transmitting the power-loss signal by the management switch to the server through connections on the management switch and over the network cable coupled between the management switch and the server so that the messages related to the performance metrics and the power-loss signal are transmitted over the network cable;

storing the unsaved data in the server to a non-volatile memory of the server based on the power-loss signal while the server is powered by the backup power supply; and shutting down the server once the unsaved data has been stored to the non-volatile memory.

2. The method of claim 1, further comprising transmitting the power-loss signal to the management switch via a first network cable, and wherein the network cable coupling the server and the management switch is a second network cable, wherein the re-transmitted signal is communicated on a reserved conductor in the second network cable independently from the messages communicating over the second cable on a different conductor.

3. The method of claim 2, wherein the power-loss signal is an asynchronous general-purpose input-output (GPIO) signal without a managed network protocol.

4. The method of claim 1, wherein the power-loss signal does not propagate outside of the rack.

5. The method of claim 1, wherein the power-loss signal passes through a repeater or an isolator disposed on the management switch motherboard.

6. A method, comprising:

receiving a loss-of-power indication signal from a rack component in an electronic equipment rack;

transmitting the loss-of-power signal to a management switch disposed in the electronic equipment rack;

re-transmitting the loss-of-power signal from the management switch to a server in the electronic equipment rack, wherein the re-transmitting is over a network cable coupled between the management switch and the server, and wherein a message related to performance metrics of the server is also transmitted over the network cable; and storing unsaved data in the server upon receipt of the loss-of-power signal at the server.

7. The method of claim 6, further comprising processing the loss-of-power signal by an electronic processor on a motherboard associated with the management switch prior to re-transmission of the loss-of-power signal to the server.

8. The method of claim 6, further comprising sending a notification to a user of the server that a loss-of-power in the electronic equipment rack has been detected.

9. The method of claim 6, wherein the server refuses to accept additional tasks upon receipt of the loss-of-power signal.

10. The method of claim 6, wherein the loss-of-power signal is generated by a pull-up or a pull-down circuit.

11. The method of claim 6, wherein the server stores the data as specified in a software routine stored on the server.

12. The method of claim 6, further comprising transmitting the unsaved data from the server to a different server in the rack for storage.

13. The method of claim 6, wherein the loss-of-power signal passes through a repeater circuit or an isolator circuit disposed on a motherboard associated with the management switch prior to being re-transmitted.

14. The method of claim 6, wherein the loss-of-power signal is transmitted over a reserved conductor sharing the network cable with the message, which uses a different conductor.

15. The method of claim 6, wherein the server comprises a baseboard management controller (BMC) configured to detect the loss-of-power signal.

16. A system, comprising:

a management switch mountable in an equipment rack and configured to:

receive a first loss-of-power signal from a monitoring component over a first network cable on a first network cable conductor;

transmit a second loss-of-power signal over a second network cable on a second network cable conductor to a server computer in the equipment rack; and transmit a message related to performance metrics of the server computer using a same second network cable as the second loss-of-power signal is transmitted, wherein the first and second loss-of-power signals do not propagate outside of the equipment rack.

17. The system of claim 16, further including a server computer in the equipment rack, wherein the server computer stores temporarily stored data and wherein the temporarily stored data includes a processing function status.

18. The system of claim 16, wherein the first loss-of-power signal is an unmanaged network protocol general-purpose-input-output (GPIO) signal.

19. The system of claim 16, further comprising the monitoring component, wherein the monitoring component comprises an uninterruptable power supply (UPS) configured to transmit the first loss-of-power signal after detecting a lapse of external power to the equipment rack.

* * * * *